US012658217B2

(12) United States Patent
Park et al.

(10) Patent No.:     US 12,658,217 B2
(45) Date of Patent:          Jun. 16, 2026

(54) WAFER-ON-WAFER MEMORY DEVICE ARCHITECTURES

(71) Applicant: Micron Technology, Inc., Boise, ID (US)

(72) Inventors: Kitae Park, Cupertino, CA (US); Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 381 days.

(21) Appl. No.: 18/228,148

(22) Filed: Jul. 31, 2023

(65) Prior Publication Data

US 2024/0062786 A1      Feb. 22, 2024

Related U.S. Application Data

(60) Provisional application No. 63/399,499, filed on Aug. 19, 2022.

(51) Int. Cl.
| | |
|---|---|
| *G11C 5/06* | (2006.01) |
| *G11C 16/08* | (2006.01) |
| *H10B 80/00* | (2026.01) |
| *H10W 20/41* | (2026.01) |
| *H10W 90/00* | (2026.01) |

(52) U.S. Cl.
CPC .............. *G11C 5/063* (2013.01); *G11C 16/08* (2013.01); *H10B 80/00* (2023.02); *H10W 20/435* (2026.01); *H10W 90/00* (2026.01)

(58) Field of Classification Search
CPC ....... G11C 5/063; G11C 16/08; G11C 29/022; G11C 16/0483; G11C 2029/0411; H01L 23/5283; H01L 25/0655; H01L 25/18; H10B 80/00
See application file for complete search history.

(56) References Cited

U.S. PATENT DOCUMENTS

| 2017/0358564 | A1* | 12/2017 | Lee .................... | H01L 25/0652 |
|---|---|---|---|---|
| 2018/0374864 | A1* | 12/2018 | Fukuzumi ............. | H10B 43/40 |
| 2020/0328180 | A1* | 10/2020 | Cheng .................... | H01L 25/18 |
| 2020/0365210 | A1* | 11/2020 | Chibvongodze ....... | G11C 16/24 |
| 2021/0125852 | A1* | 4/2021 | Or-Bach ............... | H10D 30/69 |

* cited by examiner

*Primary Examiner* — Allison Bernstein
(74) *Attorney, Agent, or Firm* — Lowenstein Sandler LLP

(57)          ABSTRACT

A memory device includes a memory array die corresponding to a memory array, an access circuitry die corresponding to peripheral circuitry to support access operations with respect to the memory array, and a bonding layer disposed between the memory array die and the access circuitry die to form an interconnection between the memory array and the access circuitry. In some embodiments, the access circuitry die further integrates a local media controller corresponding to the memory array. In some embodiments, the local media controller is located external to the access circuitry die.

20 Claims, 8 Drawing Sheets

200

205

300

305

700

START

Obtain a memory array wafer
710

Obtain an access operation wafer
720

Perform a bonding process
730

END

WAFER-ON-WAFER MEMORY DEVICE ARCHITECTURES

CROSS-REFERENCE TO RELATED APPLICATION(S)

The present application claims the benefit of U.S. Provisional Application 63/399,499, filed on Aug. 19, 2022 and entitled "WAFER-ON-WAFER MEMORY DEVICE ARCHITECTURES", the entire contents of which are incorporated by reference herein.

TECHNICAL FIELD

Embodiments of the disclosure relate generally to memory devices, and more specifically, relate to wafer-on-wafer (WoW) memory device architectures.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
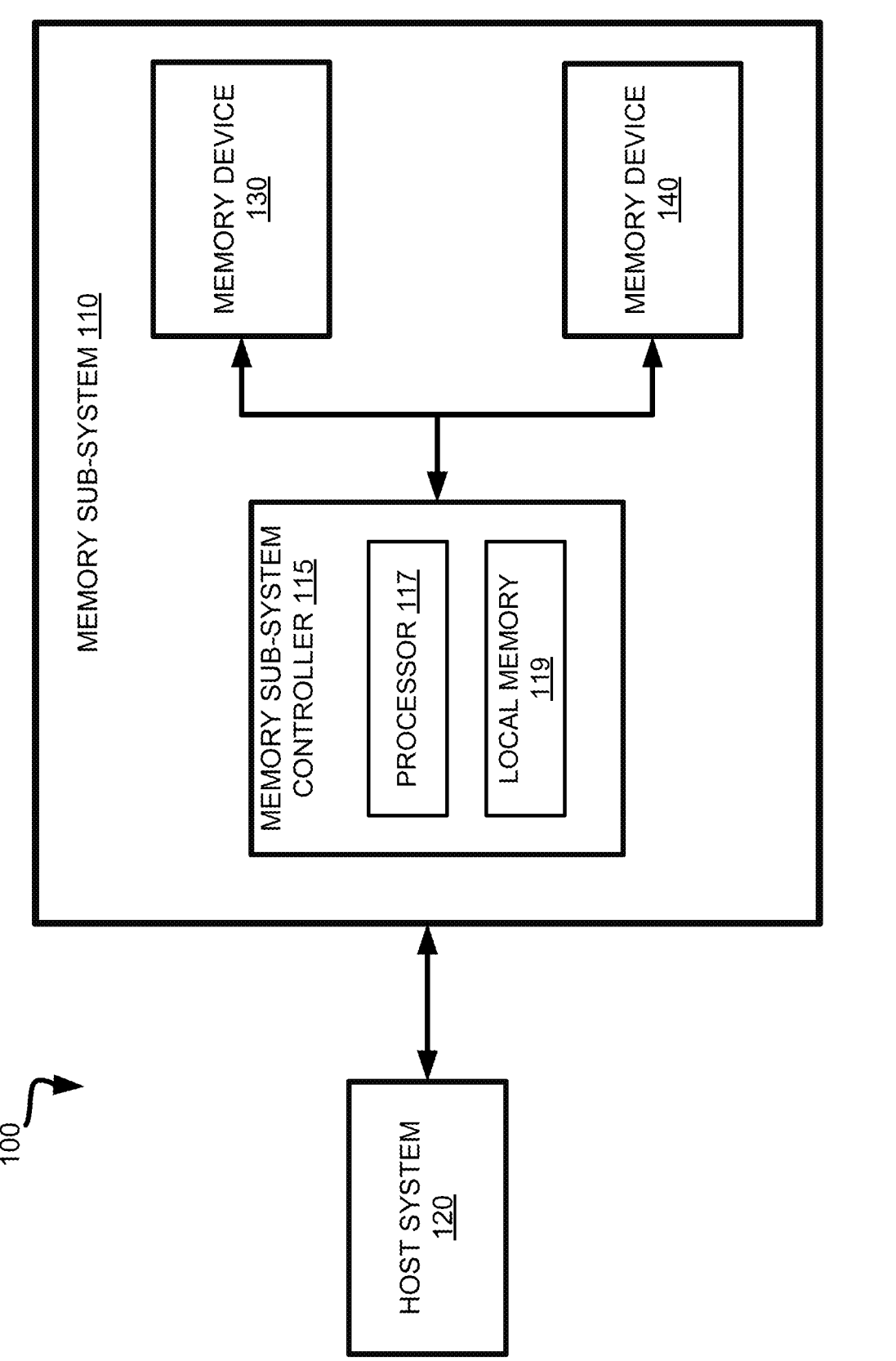
FIG. 1A illustrates an example computing system that includes a memory sub-system in accordance with some embodiments of the present disclosure.

Aspects of the present disclosure are directed to wafer-on-wafer (WoW) memory device architectures. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

One type of memory array is a three-dimensional (3D) memory array (e.g., 3D NAND). In a 3D memory array, multiple layers of cells are stacked vertically within the memory array. The vertical stacking of the 3D memory array can increase storage density as compared to two-dimensional (2D) memory arrays (i.e., planar memory arrays).

A memory device can include a memory array (e.g., 3D memory array), where the memory array is operatively coupled to peripheral circuitry (e.g., complementary metal-oxide-semiconductor (CMOS) circuitry). The peripheral circuitry can be used to support access operations (e.g., read, write or erase) with respect to the memory array. For example, the peripheral circuitry can be used to support data transmission and/or receipt to and/or from the memory array. The peripheral circuitry can include a sense amplifier, a state machine that sequences access operations, and other circuitry to generate voltages for respective functions. Examples of circuitry that can be included in the peripheral circuitry include at least one of: page buffer circuitry for supporting read and/or write operations (e.g., a data register and/or a cache register), boost voltage circuitry for generating respective access operation voltages, error correction code (ECC) circuitry, column decoder circuitry, row decoder circuitry, etc. In some implementations, the peripheral circuitry is placed adjacent to a side of the memory array on the same die. To improve spatial efficiency, in other implementations, the peripheral circuitry can be placed below the memory array, referred to a peri-under-cell (PUC) technology.

The memory device can be operatively coupled to a controller. The controller can enable outside host systems to interact with the memory array to perform access operations. The controller can include hardware (e.g., an application-specific integrated circuit (ASIC)) and firmware. The hardware can include an error correction engine, a static random-access memory (SRAM) buffer, a logical-to-physical (L2P) mapping engine, interfaces, etc. The firmware can be stored on the memory array, and can be downloaded into the SRAM upon power up. The firmware can also be stored in non-volatile memory (e.g., embedded in the hardware of the controller or in a separate die).

A memory array can have a storage density and can have a size defining an amount of physical area (i.e., footprint). As memory device technology is scaling to more advanced technology nodes (e.g., smaller transistor feature sizes), the memory array size is decreasing, while achieving the same or greater storage density. In some implementations, the size of the peripherical circuitry, if placed below the memory array, should ideally be equal to or less than the size of the memory array. However, the size of the peripheral circuitry may be unable to keep up with the decreasing size of the memory array. This can lead to an undesirable misalignment situation in which the peripheral circuitry size is greater than the memory array size, causing the length of the peripheral circuitry to exceed the length of memory array (e.g., the peripheral circuitry "sticks out" from the memory array).

Aspects of the present disclosure address the above and other deficiencies by providing for wafer-on-wafer (WoW) memory device architectures. For example, a WoW memory device can include a number of memory array dies and a number of access operation dies, where each memory array die is bonded to a respective access operation die via a bonding layer. Each memory array die can include a respective memory array of the memory device. Each access operation circuitry die can include respective access operation circuitry for supporting access operations with respect to the memory array of the corresponding memory array die. For example, the access operation circuitry can include peripheral circuitry. Examples of peripheral circuitry will be described in further detail below with reference to FIG. 1B.

The bonds between the memory array dies and the respective access operation dies can form interconnects that can render the misalignment situation of other memory device implementations described above moot. More specifically, the size of the access operation die relative to the memory array die can be rendered irrelevant. In some embodiments, the sizes of the access operation die and the memory array die are substantially equal. In some embodiments, the size of the memory array die is less than the size of the access operation circuitry die. In some embodiments, the size of the memory array die is greater than the size of the access operation circuitry die.

The interconnection can be formed by employing a bonding technique. For example, wafer-to-wafer bonding can be used to form a bond between the memory array wafer and the access operation wafer. As another example, die-to-die bonding can be used to form a bond between a die of the memory array wafer and a die of the access operation wafer. As yet another example, wafer-to-die bonding can be used to form a bond between the memory array wafer and a die of the access operation wafer, or a bond between a die of the memory array wafer and the access operation wafer.

The choice of bonding technique can depend on the size difference between a memory array die and an access operation die. For example, if each memory array die is smaller than its respective access operation die, then each memory array die can be bonded to its respective access operation die on the access operation wafer. Further details regarding this example will be described below with reference to FIGS. 2A-2B. As another example, if each memory array die is larger than its respective access operation die, then each access operation die can be bonded to its respective memory array die on the memory array wafer. Further details regarding this example will be described below with reference to FIGS. 3A-3B. Prior to the bonding, an access operation die of the access operation wafer can be tested to prevent a good memory array die from being wasted on a bad access operation die.

The bonding layer should be conductive to transmit signals. Additionally, the bonding layer should be adhesive. In some embodiments, the bonding layer between each memory array die and access operation die is a hybrid bonding layer formed using hybrid bonding. The hybrid bonding forms a hybrid bonding layer between the memory array die and the access operation die. Hybrid bonding is a type of direct wafer bonding.

Since the size of the access operation circuitry die can exceed the size of the memory array die, each memory array can have an increased storage density without concerns about the mismatch scenario. For example, instead of having four memory arrays each having a storage density of D, a memory device described herein can include a single memory array having a storage density of 4D.

In some embodiments, a local media controller can be monolithically integrated within the corresponding access operation die. For example, the local media controller can be combined with the corresponding peripheral circuitry if the access operation die is much smaller than the corresponding memory array (e.g., if the storage density of the memory array is large). Monolithically integrating the local media controller within the access operation die can reduce input/output (I/O) traffic current consumption. Further details regarding wafer-on-wafer (WoW) memory device architectures will be described in further detail below with reference to FIGS. 1A-7.

Advantages of the present disclosure include, but are not limited to, improved memory device performance and reliability. For example, WoW memory device architectures described herein can enable a low density solution that can obviate mismatch without performance penalty.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array.

Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, and as will be described in further detail below with reference to FIG. 1B, the memory devices 130 can include local media controllers that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

Figure 1B:
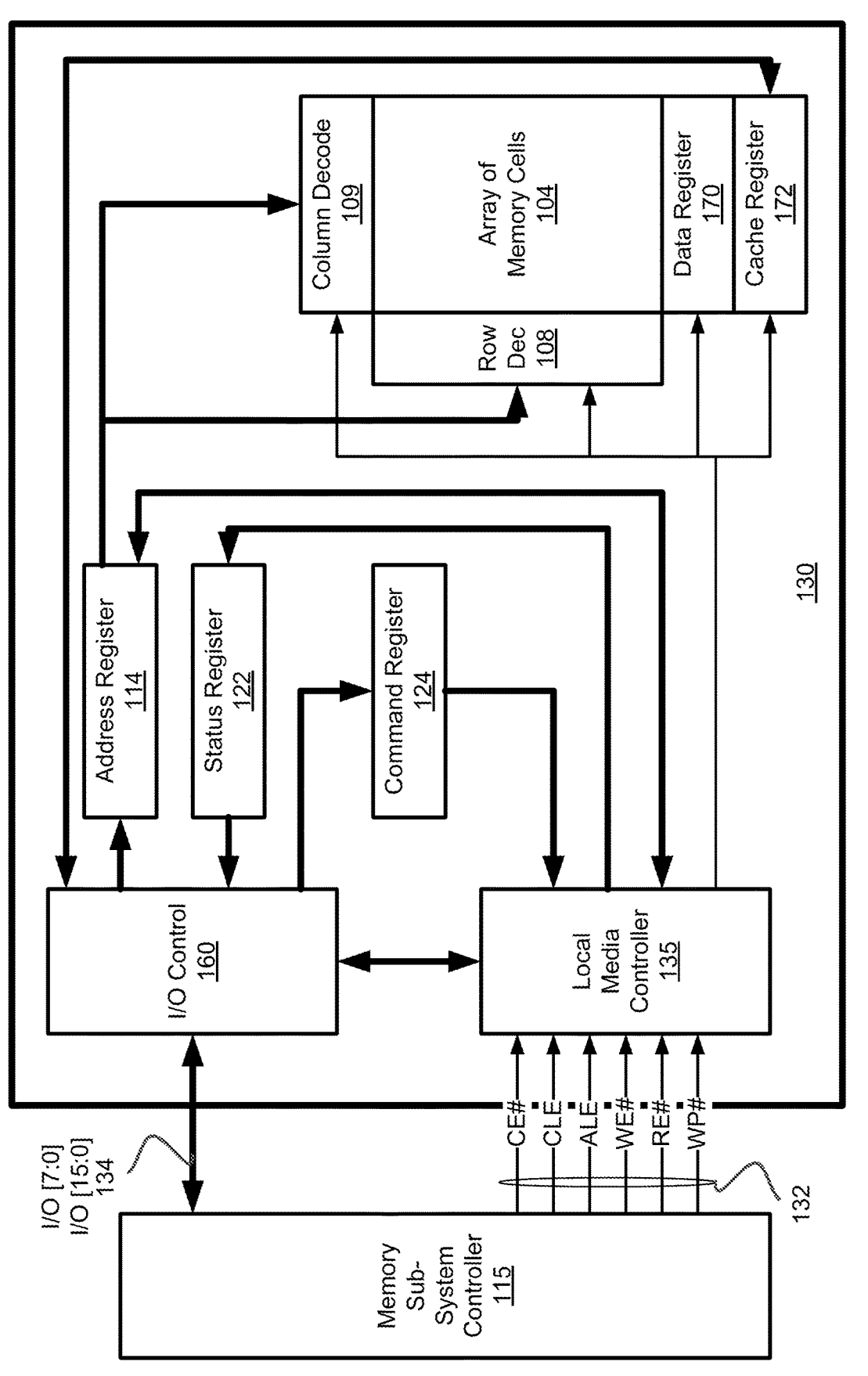
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 (i.e., memory array) logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

The memory device 130 can include peripheral circuitry. The peripheral circuitry can be used to support access operations (e.g., read, write or erase) with respect to the array of memory cells 104. For example, the peripheral circuitry can be used to support data transmission and/or receipt to and/or from the array of memory cells 104.

For example, the peripheral circuitry can include row decode circuitry 108 and column decode circuitry 109, which can be provided to decode address signals. Address signals are received and decoded to access the array of memory cells 104. As another example, the peripheral circuitry can include input/output (I/O) control circuitry 160 to manage input of commands, addresses and data to the memory device 130 as well as output of data and status information from the memory device 130. As another example, the peripheral circuitry can include an address register 114 in communication with I/O control circuitry 160 and row decode circuitry 108 and column decode circuitry 109 to latch the address signals prior to decoding. As another example, the peripheral circuitry can include a command register 124 in communication with I/O control circuitry 160 and local media controller 135 to latch incoming commands. Other examples of circuitry that can be included in the peripheral circuitry include at least one of: boost voltage circuitry for generating respective access operation voltages, error correction code (ECC), etc.

A local media controller 135 internal to the memory device 130 controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
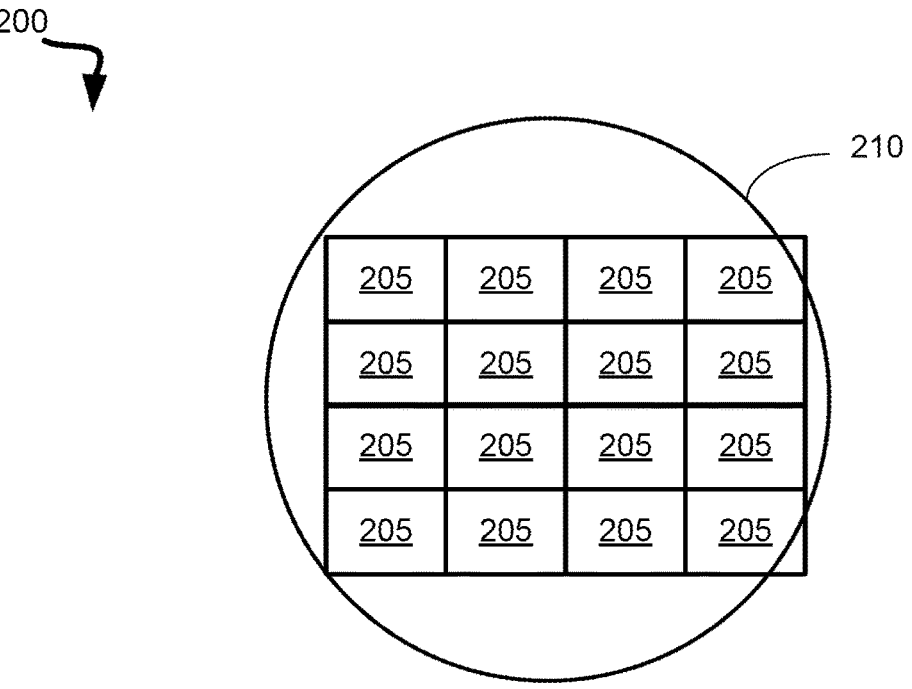
FIGS. 2A-5 are diagrams illustrating example wafer-on-wafer (WoW) memory device architectures, in accordance with some embodiments of the present disclosure.
Figure 2B:
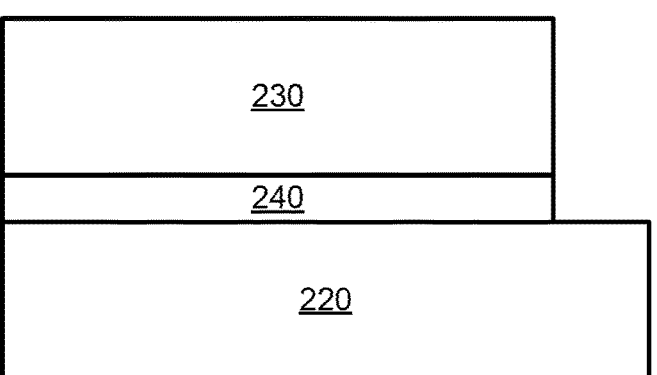

FIGS. 2A-2B are diagrams illustrating example wafer-on-wafer (WoW) memory device architecture, in accordance with some embodiments of the present disclosure. More specifically, FIG. 2A illustrates an apparatus 200 including multiple memory devices 205 disposed on a wafer 210, and FIG. 2B shows an example memory device 205. In this illustrative example, the wafer 210 is an access operation wafer. The memory device 205 includes an access operation die 220 of the wafer 210, a memory array die 230 (e.g., including the memory array 104 of FIG. 1B), and a bonding layer 240 providing an interconnection between the access operation die 220 and the memory array die 230. In some embodiments, the bonding layer 240 is a hybrid bonding layer. As shown, the access operation die 220 is larger than the memory array die 230, which is why the memory array die 230 was bonded on the access operation die 220.

Figure 3A:
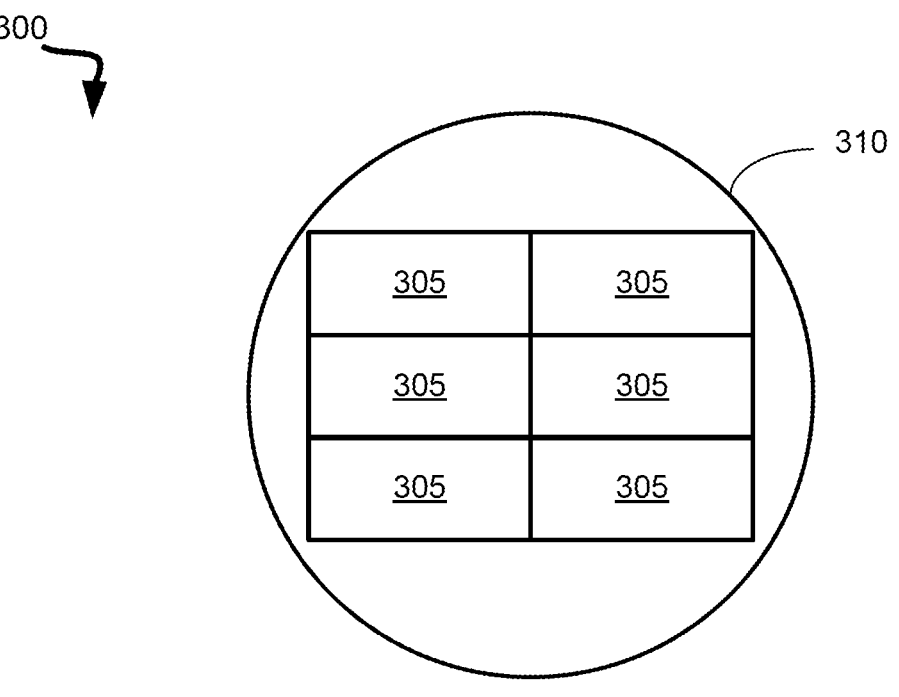
Figure 3B:
Figure 3B:
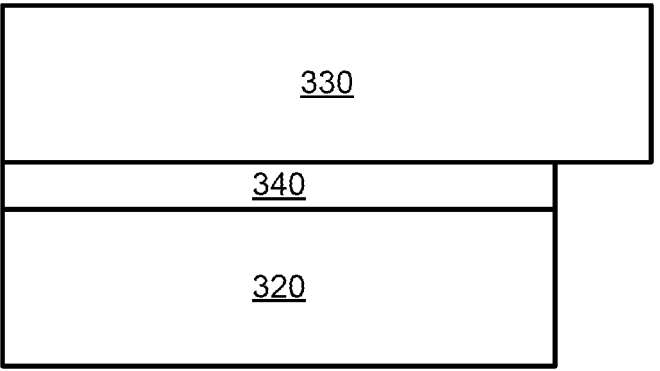

FIGS. 3A-3B are diagrams illustrating example wafer-on-wafer (WoW) memory device architecture, in accordance with some embodiments of the present disclosure. More specifically, FIG. 3A illustrates an apparatus 300 including multiple memory devices 305 disposed on a wafer 310, and FIG. 3B shows an example memory device 305. In this illustrative example, the wafer 310 is a memory array wafer. The memory device 305 includes an access operation die 320, a memory array die 330 (e.g., including the memory array 104 of FIG. 1B) of the wafer 310, and a bonding layer 340 providing an interconnection between the access operation die 320 and the memory array die 330. In some embodiments, the bonding layer 340 is a hybrid bonding layer. As shown, the access operation die 320 is smaller than the memory array die 330, which is why the access operation die 320 was bonded on the memory array die 330.

The access operation circuitry of the access operation die 220 of FIGS. 2A-2B and the access operation die 320 of FIGS. 3A-3B can include peripheral circuitry. Further details regarding peripheral circuitry are described above with reference to FIG. 1B.

In some embodiments, the access operation circuitry of the access operation die 220 and/or the access operation die 320 can further include a local media controller (e.g., local media controller 135 of FIG. 1B). That is, the local media controller can be monolithically integrated within the access operation die 220 and/or the access operation die 320. As will now be described in further detail below with reference to FIGS. 4-5, the local media controller can be located external to the access operation die 220 and/or the access operation die 320.

Figures 4, 5:
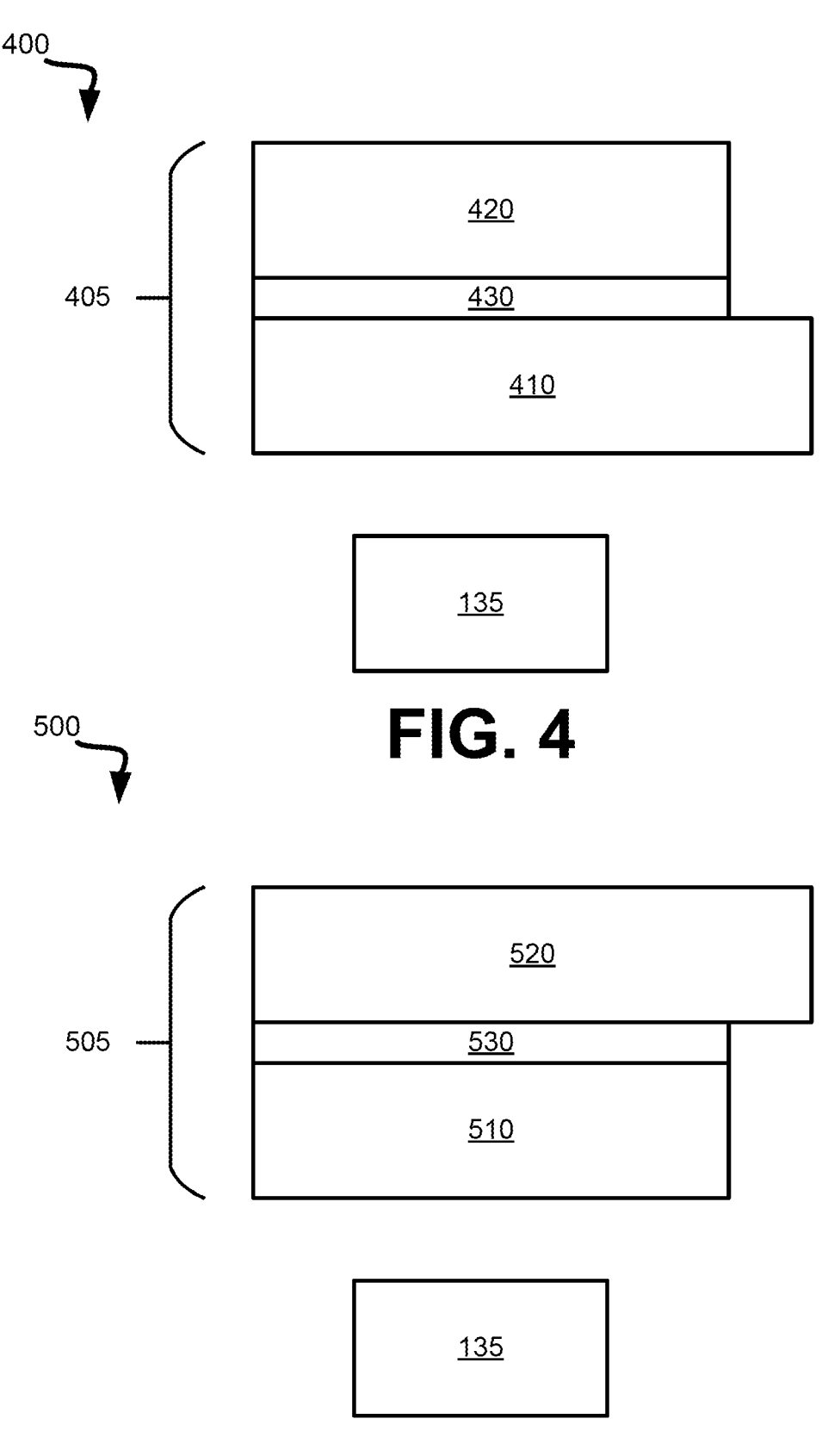

FIG. 4 is a diagram of an apparatus 400 illustrating an example wafer-on-wafer (WoW) memory device architecture, in accordance with some embodiments of the present disclosure. As shown, the apparatus 400 includes a memory device 405. The memory device 405 includes an access operation die 410 (similar to the access operation die 220 of FIG. 2B), a memory array die 420 (similar to the memory array die 230 of FIG. 2B), and a bonding layer 430 (similar to the bonding layer 240 of FIG. 2B) providing an interconnection between the access operation die 410 and the memory array die 420. More specifically, instead of the access operation die 410 including the local media controller, the local media controller 135 is external to the access operation die 410.

FIG. 5 is a diagram of an apparatus 500 illustrating an example wafer-on-wafer (WoW) memory device architecture, in accordance with some embodiments of the present disclosure. As shown, the apparatus 500 includes a memory device 505. The memory device 505 includes an access operation die 510 (similar to the access operation die 320 of FIG. 3B), a memory array die 520 (similar to the memory array die 330 of FIG. 3B), and a bonding layer 530 (similar to the bonding layer 340 of FIG. 3B) providing an interconnection between the access operation die 510 and the memory array die 520. More specifically, instead of the access operation die 510 including the local media controller, the local media controller 135 is external to the access operation die 510.

Figure 6:
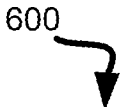
FIG. 6 is a diagram of a wafer-on-wafer (WoW) die including a monolithically integrated local media controller, in accordance with some embodiments of the present disclosure.
Figure 6:
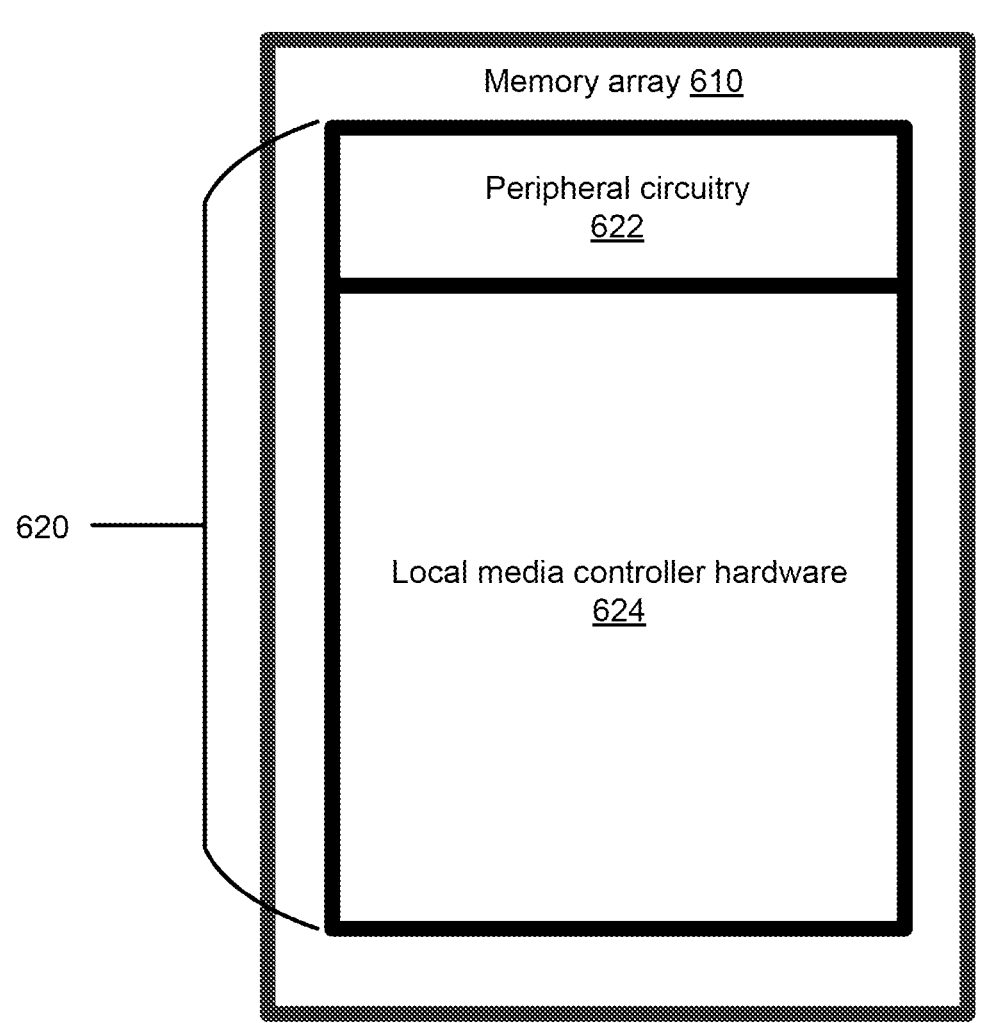

FIG. 6 is a diagram of a wafer-on-wafer (WoW) die 600, in accordance with some embodiments of the present disclosure. including a monolithically integrated local media controller. As shown, the WoW die 600 includes a memory array 610 and access operation circuitry 620. In this illustrative example, the access operation circuitry incudes peripheral circuitry combined with local media controller hardware 624. For example, the local media controller hardware 624 can include an ASIC. The local media controller hardware 624 can include a number of components, such as an error correction engine, an SRAM buffer, L2P mapping engine, interfaces, etc. Thus, the WoW die 600 includes a monolithically integrated local media controller.

Figure 7:
FIG. 7 is a flow diagram of an example method for fabricating a wafer-on-wafer (WoW) memory device, in accordance with some embodiments of the present disclosure.
Figure 7:
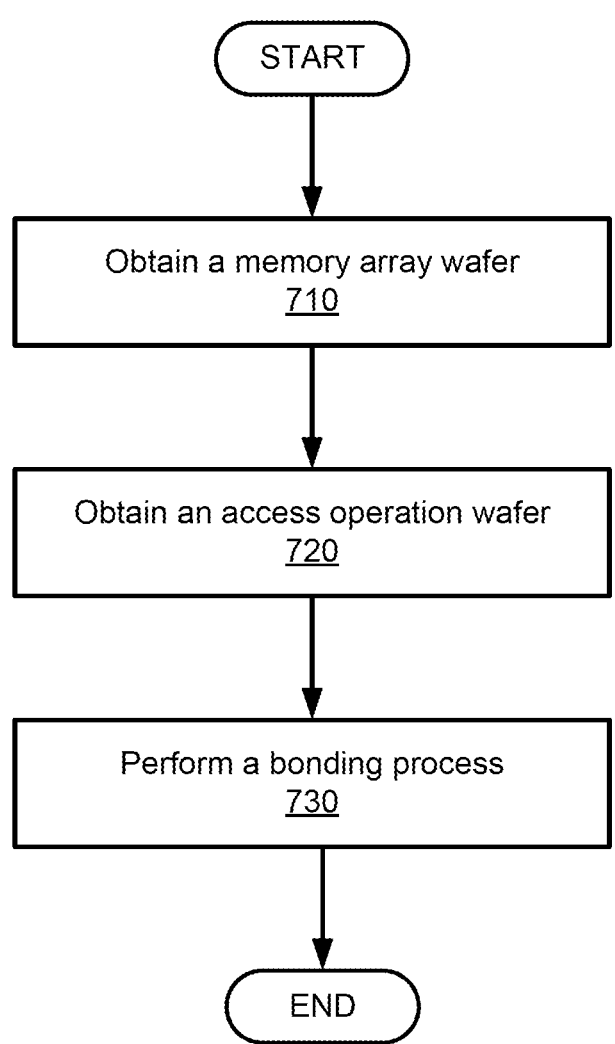

FIG. 7 is a flow diagram of an example method 700 for fabricating a wafer-on-wafer (WoW) memory device, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, a memory array wafer is obtained. For example, the memory array wafer can include a set of memory array dies. Each memory array die of the set of memory array dies corresponds to a respective memory array.

At operation 720, an access operation wafer is obtained. For example, the access operation wafer can include a set of access operation dies. Each access operation die of the set of access operation dies corresponds to respective access operation circuitry. The access operation circuitry can include peripheral circuitry. The peripheral circuitry can be used to support access operations (e.g., read, write or erase) with respect to the memory array. For example, the peripheral circuitry can be used to support data transmission and/or receipt to and/or from the memory array. Further details regarding peripheral circuitry are described above with reference to FIG. 1B.

In some embodiments, each access operation die further integrates a respective local media controller. Further details regarding these embodiments are described above with reference to FIGS. 2A-3B.

In some embodiments, each local media controller is external to the access operation die. For example, the local media controller can be implemented on a separate integrated circuit with respect to the access operation die. Further details regarding these embodiments are described above with reference to FIGS. 4-5.

At operation 730, a bonding process is performed. For example, performing the bonding process can including forming a bond between at least a portion of the memory array wafer to at least a portion of the access operation wafer. More specifically, performing the bonding process can include forming a bonding layer between a memory array die and a respective access operation die. The bonding layer provides an interconnection between the memory array die and the respective access operation die. For example, the bonding layer can be formed on an upper surface of the access operation die and a lower surface of the respective memory array die, such that the access operation die is located below the access operation die (i.e., PUC technology).

In some embodiments, the access operation die is larger than the respective memory array die. In these embodiments, the memory array die can be bonded to the access operation die of the access operation wafer. Thus, upon bonding, the access operation die can extend beyond the respective memory array die. Further details regarding these embodiments are described above with reference to FIGS. 2A-2B.

In some embodiments, the access operation die is smaller than the respective memory array die. In these embodiments, the access operation die can be bonded to the memory array die of the memory array wafer. Thus, upon bonding, the memory array die can extend beyond the respective access operation die. Further details regarding these embodiments are described above with reference to FIGS. 3A-3B.

In some embodiments, performing the bonding process includes performing a hybrid bonding process to form a hybrid bonding layer.

In some embodiments, performing the bonding process further comprises testing at least one die. A die can be tested to determine whether the die is valid (e.g., good) prior to bonding. For example, the at least one die can include an access operation die. If an access operation die is valid, this means that the access operation die is suitable to be bonded to a respective memory array die. If an access operation die is invalid, this means that the access operation die is unsuitable to be bonded to a respective memory array die. Accordingly, the testing can be performed to eliminate invalid dies that are unsuitable for bonding.

Further details regarding operations 710-730 are described above with reference to FIGS. 1A-6.

Figure 8:
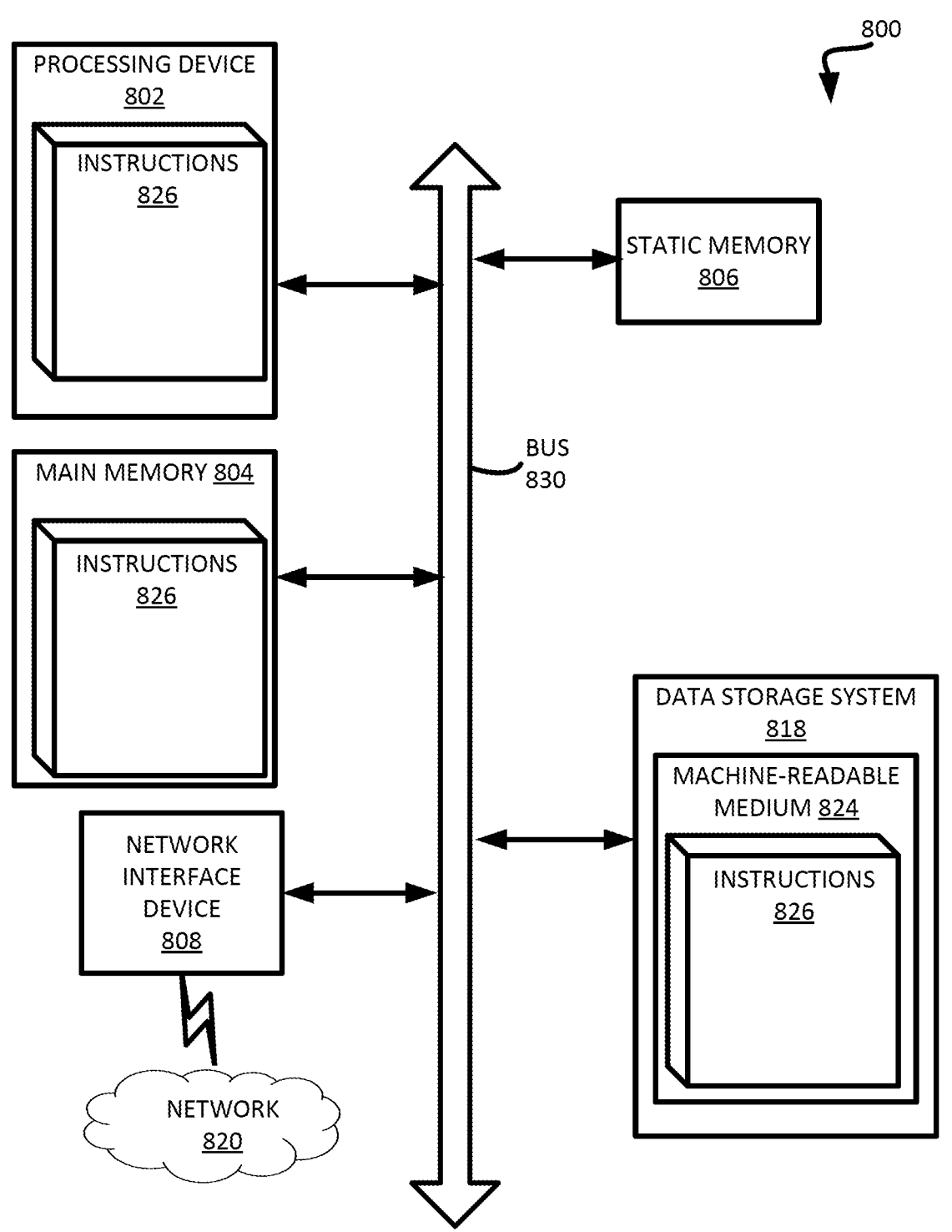
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the local media controller 135 and/or the PR component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or RDRAM, etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1A.

In one embodiment, the instructions 826 include instructions to implement functionality corresponding to a local media controller and/or peripheral circuitry. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array die corresponding to a memory array;
   an access operation die corresponding to peripheral circuitry to support access operations with respect to the memory array, wherein the access operation die further comprises circuitry that integrates a local media controller corresponding to the memory array; and
   a bonding layer disposed between the memory array die and the access operation die to form an interconnection between the memory array and the peripheral circuitry.

2. The memory device of claim 1, wherein the bonding layer comprises a hybrid bonding layer.

3. The memory device of claim 1, wherein the local media controller includes at least one of: an error correction engine, a static random-access memory (SRAM) buffer, a logical-to-physical (L2P) mapping engine, or an interface.

4. The memory device of claim 1, wherein the bonding layer is disposed on a lower layer of the memory array die and an upper layer of the access operation die.

5. The memory device of claim 1, wherein the memory array die extends beyond the access operation die.

6. The memory device of claim 1, wherein the access operation die extends beyond the memory array die.

7. The memory device of claim 1, wherein the peripheral circuitry comprises at least one of: page buffer circuitry, boost voltage circuitry, error correction code (ECC) circuitry, column decoder circuitry, or row decoder circuitry.

8. A memory device comprising:
a memory array die corresponding to a memory array;
an access operation die corresponding to peripheral circuitry to support access operations with respect to the memory array;
a bonding layer disposed between the memory array die and the access operation die to form an interconnection between the memory array and the peripheral circuitry, wherein the memory array die is bonded to the access operation die to form a bonded die pair; and
a local media controller specifically corresponding to the memory array die, wherein the local media controller is located external to the access operation die.

9. The memory device of claim 8, wherein the bonding layer comprises a hybrid bonding layer.

10. The memory device of claim 8, wherein the local media controller includes at least one of: an error correction engine, a static random-access memory (SRAM) buffer, a logical-to-physical (L2P) mapping engine, or an interface.

11. The memory device of claim 8, wherein the bonding layer is disposed on a lower layer of the memory array die and an upper layer of the access operation die.

12. The memory device of claim 8, wherein the memory array die extends beyond the access operation die.

13. The memory device of claim 8, wherein the access operation die extends beyond the memory array die.

14. The memory device of claim 8, wherein the peripheral circuitry comprises at least one of: page buffer circuitry, boost voltage circuitry, error correction code (ECC) circuitry, column decoder circuitry, or row decoder circuitry.

15. A method comprising:
obtaining a memory array wafer comprising a set of memory array dies, wherein each memory array die of the set of memory array dies corresponds to a respective memory array of a memory device;
obtaining an access operation wafer comprising a set of access operation dies, wherein each access operation die of the set of access operation dies corresponds to respective peripheral circuitry of the memory device to support access operations with respect to the memory array;
performing a wafer-to-wafer bonding process to bond the memory array wafer to the access operation wafer and obtain bonded wafers; and
dicing the bonded wafers to form a set of bonded die pairs, wherein each bonded die pair of the set of bonded die pairs comprises a memory array die bonded to a respective access operation die.

16. The method of claim 15, wherein performing the bonding process comprises forming a hybrid bonding layer.

17. The method of claim 15, further comprising testing the access operation wafer to identify any defective access operation dies prior to performing the bonding process.

18. The method of claim 15, wherein the memory device further comprises a local media controller integrated within the respective access operation die, and wherein the local media controller includes at least one of: an error correction engine, a static random-access memory (SRAM) buffer, a logical-to-physical (L2P) mapping engine, or an interface.

19. The method of claim 15, wherein the memory array die extends beyond the respective access operation die.

20. The method of claim 15, wherein the respective access operation die extends beyond the memory array die.

* * * * *